(12) United States Patent
Okamoto et al.

(10) Patent No.: US 8,124,544 B2
(45) Date of Patent: Feb. 28, 2012

(54) METHOD FOR MANUFACTURING SEMICONDUCTOR DEVICE

(75) Inventors: Satoru Okamoto, Kanagawa (JP); Teruyuki Fujii, Kanagawa (JP); Hideto Ohnuma, Kanagawa (JP); Akihiro Ishizuka, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 245 days.

(21) Appl. No.: 12/477,303

(22) Filed: Jun. 3, 2009

(65) Prior Publication Data

US 2009/0246953 A1  Oct. 1, 2009

Related U.S. Application Data

(62) Division of application No. 11/273,740, filed on Nov. 15, 2005, now Pat. No. 7,547,627.

(30) Foreign Application Priority Data

Nov. 29, 2004 (JP) .................................. 2004-343320

(51) Int. Cl.
*H01L 21/302* (2006.01)
*H01L 21/461* (2006.01)

(52) U.S. Cl. ............ 438/745; 438/9; 438/706; 438/622; 257/E23.006; 257/E21.17; 257/E21.229; 257/E21.304; 257/E21.646

(58) Field of Classification Search .................. 438/238, 438/381, 149, 553, 9, 622, 648, 683, 685, 438/686, 688, 663, 692, 706, 745; 257/E21.006, 257/17, 229, 304, 646
See application file for complete search history.

(56) References Cited

U.S. PATENT DOCUMENTS

| 5,296,653 | A  | 3/1994 | Kiyota et al. |
| 6,396,078 | B1 | 5/2002 | Uochi et al. |
| 6,512,271 | B1 | 1/2003 | Yamazaki et al. |
| 6,534,826 | B2 | 3/2003 | Yamazaki |
| 6,593,235 | B2 | 7/2003 | Uochi et al. |
| 6,753,257 | B2 | 6/2004 | Yamazaki |
| 6,791,112 | B2 | 9/2004 | Yamazaki et al. |

(Continued)

FOREIGN PATENT DOCUMENTS

EP  1 003 223 A2  5/2000

(Continued)

OTHER PUBLICATIONS

Office Action re Chinese application No. CN 200510128580.3, dated Jul. 25, 2008 (with English translation).

*Primary Examiner* — David Nhu
(74) *Attorney, Agent, or Firm* — Husch Blackwell LLP

(57) ABSTRACT

It is an object of the present invention to provide a semiconductor device including a wiring having a preferable shape. A manufacturing method includes the steps of forming a first conductive layer connected to an element and a second conductive layer thereover; forming a resist mask over the second conductive layer; processing the second conductive layer by dry etching with the use of the mask; and processing the first conductive layer by wet etching with the mask left, wherein the etching rate of the second conductive layer is higher than that of the first conductive layer in the dry etching, and wherein the etching rate of the second conductive layer is the same as or more than that of the first conductive layer in the wet etching.

34 Claims, 13 Drawing Sheets

U.S. PATENT DOCUMENTS

| | | |
|---|---|---|
| 6,870,870 B2 | 3/2005 | Sakata et al. |
| 6,894,311 B2 | 5/2005 | Maeda et al. |
| 6,908,562 B2 * | 6/2005 | Hakamada ............... 216/24 |
| 6,909,114 B1 | 6/2005 | Yamazaki |
| 6,930,047 B2 | 8/2005 | Yamazaki et al. |
| 7,037,766 B2 | 5/2006 | Maeda et al. |
| 7,161,641 B2 | 1/2007 | Nakayoshi et al. |
| 7,172,928 B2 | 2/2007 | Yamazaki |
| 7,439,543 B2 | 10/2008 | Yamazaki |
| 7,547,627 B2 * | 6/2009 | Okamoto et al. ............ 438/622 |
| 2002/0048863 A1 | 4/2002 | Hatta |
| 2002/0070385 A1 | 6/2002 | Yamagata |
| 2002/0171085 A1 | 11/2002 | Suzawa et al. |
| 2003/0090612 A1 | 5/2003 | Nakayoshi et al. |
| 2005/0017242 A1 | 1/2005 | Yamazaki et al. |
| 2005/0156179 A1 | 7/2005 | Yamagata |
| 2006/0051906 A1 | 3/2006 | Yamazaki |

FOREIGN PATENT DOCUMENTS

| | | |
|---|---|---|
| EP | 2 259 292 A2 | 12/2010 |
| JP | 1-255830 | 10/1989 |
| JP | 5-216070 | 8/1993 |
| JP | 7-169837 | 7/1995 |
| JP | 2000-148042 | 5/2000 |
| JP | 2002-111004 | 4/2002 |
| JP | 2002-341367 | 11/2002 |
| JP | 2003-149674 | 5/2003 |
| JP | 2004-297075 | 10/2004 |
| WO | WO 03/036707 A1 | 5/2003 |

* cited by examiner

METHOD FOR MANUFACTURING SEMICONDUCTOR DEVICE

This application is a divisional of copending application Ser. No. 11/273,740 filed on Nov. 15, 2005.

BACKGROUND OF THE INVENTION

1. Field of the Invention

The present invention relates to a method for manufacturing a semiconductor device having a wiring, where a plurality of conductive layers are stacked, and to a method for manufacturing a semiconductor device having a wiring, where a plurality of conductive layers is each formed of a different material. In particular, the present invention relates to a method for manufacturing a semiconductor device having a wiring where a conductive layer containing aluminum (Al) as the main component is stacked over a conductive layer containing molybdenum (Mo) as the main component.

2. Description of the Related Art

A method for manufacturing a wiring by stacking a plurality of conductive layers over an insulating surface and etching the stack is suggested (see Reference 1: Japanese Patent Application Laid-Open No. H07-169837).

The method for manufacturing a wiring mentioned in Reference 1 is explained with reference to FIGS. 6A to 6C. A first conductive layer 601 and a second conductive layer 602 over the first conductive layer 601 are formed over an insulating surface 600. A resist mask 603 is formed over the second conductive layer 602 (FIG. 6A). With the use of the mask 603, the second conductive layer 602 is dry-etched until the surface of the first conductive layer 601 is exposed to form a second conductive layer 612 processed into an arbitrary shape (FIG. 6B). The first conductive layer 601 is wet-etched with the mask left to form a first conductive layer 611. In such a manner, a wiring with the stack of the first conductive layer 611 and the second conductive layer 612 are formed (FIG. 6C).

In the method for manufacturing a wiring mentioned in Reference 1, the etching rate of the second conductive layer 612 is set extremely lower than that of the first conductive layer 601 in the wet etching for processing the first conductive layer 601. In such a manner, the second conductive layer 612 that is already processed into an arbitrary shape is made be hardly etched in the wet etching.

In the method for manufacturing a wiring mentioned in Reference 1, the etching rate of the second conductive layer 612 is set lower than that of the first conductive layer 601 in the wet etching. Therefore, in the wet etching, the first conductive layer 611 is at risk of being hollowed by having the end of the second conductive layer 612 etched even on the inner side or at risk of the wiring with the stack of the first conductive layer 611 and the second conductive layer 612 having a reverse-tapered shape (see FIG. 6C). When a film is formed over the wiring formed in such a manner, failure such as the discontinuity of the film occurs.

SUMMARY OF THE INVENTION

It is an object of the present invention to prevent a wiring with the stack of a plurality of conductive layers from being hollowed and having a reverse-tapered shape and to reduce failure such as the discontinuity of a film formed over the wiring.

One feature of the present invention is that, in a method for manufacturing a semiconductor device comprising the steps of forming a first conductive layer over an insulating surface; forming a second conductive layer over the first conductive layer; forming a resist mask over the second conductive layer; processing the second conductive layer into an arbitrary shape by performing first etching with the use of the mask by dry etching; and processing the first conductive layer to form a wiring by performing second etching with the mask left by wet etching, wherein the etching rate of the second conductive layer is set higher than that of the first conductive layer in the dry etching (aspect 1), and the etching rate of the second conductive layer is set equal to or higher than that of the first conductive layer in the wet etching (aspect 2).

Molybdenum can be used as a material of the first conductive layer, and a material containing aluminum as the main component can be used as a material of the second conductive layer. When molybdenum is used as a material of the first conductive layer and a material containing aluminum as the main component is used as a material of the second conductive layer, the state where "the etching rate of the second conductive layer is set the equal to or higher than that of the first conductive layer in the wet etching," that is, the above aspect 2 according to the following condition 1 is realized.

Wet etching is performed by using a mixed solution of phosphoric acid and nitric acid, in which the concentration ratio of the phosphoric acid to the nitric acid is 70% or more (condition 1).

Note that the temperature of the mixed solution is 40° C. or more in the condition 1.

In addition, the first conductive layer may also be connected to an element such as a thin film transistor.

Dry etching, anisotropic etching, is known to process accurately depending on a mask. Since the second conductive layer is processed by dry etching, the processing accuracy of the second conductive layer can be improved.

According to the aspect 1, "the etching rate of the second conductive layer is set higher than that of the first conductive layer in the dry etching," so that the first conductive layer is left so as to cover the insulating surface while processing the second conductive layer in the dry etching. Therefore, charge generated in the dry etching can be released through the first conductive layer left over the insulating surface as a path. Accordingly, the charge generated in the dry etching can be prevented from being accumulated in an insulating film or the like; thus, damage such as dielectric breakdown due to the accumulated charge can be reduced.

Since plasma like in dry etching is not generated in wet etching, charge is not accumulated in an insulating film or the like; thus, there is no problem of damage such as dielectric breakdown. Wet etching is used for processing the first conductive layer; therefore, there is no problem of damage such as dielectric breakdown even if there is no path through which charge is released during the dry etching due to the process. Accordingly, the first conductive layer can be etched by wet etching until part of the insulating surface is exposed.

According to the aspect 2, "the etching rate of the second conductive layer is set equal to or higher than that of the first conductive layer in the wet etching," so that the end of the first conductive layer processed by the wet etching is placed at the same position as the end of the second conductive layer or outside the end of the second conductive layer. Thus, in a wiring with the stack of the first conductive layer and the second conductive layer, the first conductive layer is not at risk of being hollowed by having the end of the second conductive layer etched even on the inner side and the wiring does not have a reverse-tapered shape. Accordingly, failure such as the discontinuity of a film formed over the stacked wiring can be reduced.

When molybdenum is used as a material of the first conductive layer and a material containing aluminum as the main component can be used as a material of the second conductive layer, it is found that the aspect 2 can be realized by performing the wet etching so that the condition 1, "wet etching is performed by using a mixed solution of phosphoric acid and nitric acid, in which the concentration ratio of the phosphoric acid to nitric acid is 70% or more" is satisfied.

Further, wet etching gives less physical damage to a base of a layer to be etched compared with dry etching and can have high selectivity to the base; therefore, unevenness on the exposed insulating surface can be reduced. Furthermore, dust or a residue generated during the dry etching, dust that exists over the insulating surface, or the like can also be washed off by the wet etching.

As mentioned above, by forming a stacked wiring by dry etching and wet etching thereafter, processing accuracy can be improved more than the case where only wet etching is used. In addition, the wiring can be formed without damage such as dielectric breakdown during dry etching. The stacked wiring can be formed in a preferable shape, and a gap can be prevented from being made between the side surface of the stacked wiring and a film formed over the stacked wiring. Therefore, failure such as the discontinuity of the film can be reduced. Further, unevenness on the exposed insulating surface can be reduced and dust or a residue can be reduced; therefore, such unevenness or a defect generated due to dust or a residue can be suppressed.

Especially when the first conductive layer is connected to an element, charge generated in dry etching gives extremely negative effect on the element; thus, there is fear of breaking the element. In the case where the first conductive layer is connected to an element, the present invention is effective for being able to prevent the element from breaking.

These and other objects, features and advantages of the present invention will become more apparent upon reading of the following detailed description along with the accompanied drawings.

DETAILED DESCRIPTION OF THE INVENTION

Embodiment Mode 1

Embodiment Mode 1 will be explained with FIGS. 1A to 1D.

Figure 1A:
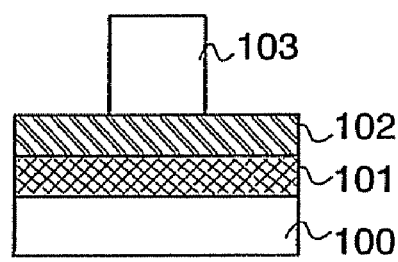
FIGS. 1A to 1D are views each showing Embodiment Mode 1.

A first conductive layer 101 is formed over an insulating surface 100. The first conductive layer 101 may also have a stacked structure. A second conductive layer 102 is formed over the first conductive layer 101. The second conductive layer 102 may also have a stacked structure. A resist mask 103 is formed over the second conductive layer 102 (FIG. 1A).

Figure 1B:
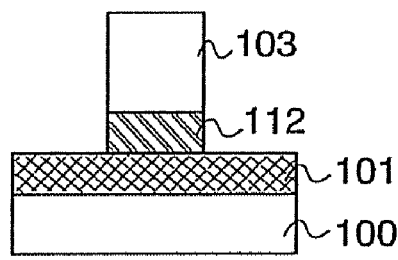

First etching with the use of the mask 103 is performed by dry etching to process the second conductive layer 102. In this dry etching, the etching rate of the second conductive layer 102 is set higher than that of the first conductive layer 101. In such a manner, a second conductive layer 112 is formed (FIG. 1B).

Figure 1C:
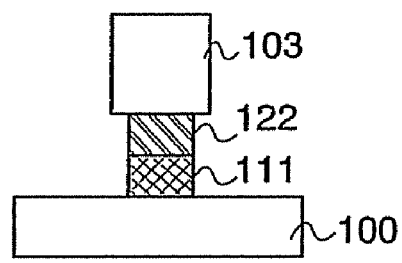
Figure 1D:
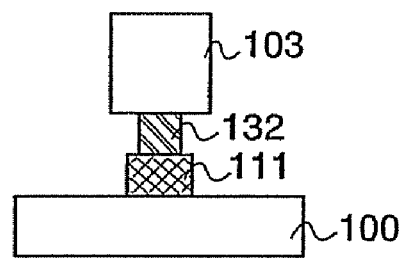

Second etching is performed by wet etching with the mask 103 left to process the first conductive layer 101. In this wet etching, the etching rate of the second conductive layer 112 is set equal to or higher than that of the first conductive layer 101. In such a manner, a wiring with the stack of a second conductive layer 122 and a first conductive layer 111 (FIG. 1C) or a wiring with the stack of a second conductive layer 132 and the first conductive layer 111 (FIG. 1D) is formed. In the wet etching, the structure of FIG. 1C is obtained when each etching rate of the second conductive layer 112 and the first conductive layer 101 is the same, whereas the structure of FIG. 1D is obtained when the etching rate of the second conductive layer 112 is higher than that of the first conductive layer 101.

Thereafter, the mask 103 is removed.

In addition, the amount to be etched in a direction parallel to the insulating surface in the wet etching can be reduced by making the thickness of the first conductive layer 101 thinner than that of the second conductive layer 102. FIGS. 8A to 8D each show an example of the case in which the thickness of the first conductive layer 101 is thinner than that of the second conductive layer 102 in FIGS. 1A to 1D. In FIGS. 8A to 8D, portions identical to those in FIGS. 1A to 1D are denoted by the same reference numerals and the descriptions are omitted.

The processing accuracy of a wiring can be further improved by thinning the thickness of a first conductive layer 101 than that of a second conductive layer 102 as shown in FIGS. 8A to 8D.

The processing accuracy of a wiring can be further improved by making the thickness of the second conductive layer 102 five times or more, preferably 10 times or more, than that of the first conductive layer 101, for example. In addition, the thickness of the second conductive layer 102 can be 300 nm to 7 μm.

Embodiment Mode 2

Embodiment Mode 2 will be explained with reference to FIGS. 2A to 2F.

Figure 2A:
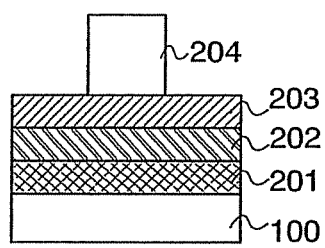
FIGS. 2A to 2F are views each showing Embodiment Mode 2.

A first conductive layer 201 is formed over an insulating surface 100. The first conductive layer 201 may also have a stacked structure. A second conductive layer 202 is formed over the first-conductive layer 201. The second conductive layer 202 may also have a stacked structure. A third conductive layer 203 is formed over the second conductive layer 202. The third conductive layer 203 may also have a stacked structure. A resist mask 204 is formed over the third conductive layer 203 (FIG. 2A).

Figure 2B:
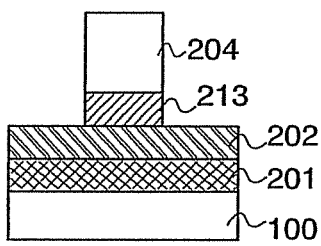

The third conductive layer 203 is processed by first etching with the use of the mask 204. In this etching, the etching rate of the third conductive layer 203 is set higher than that of the second conductive layer 202. In such a manner, a third conductive layer 213 is formed (FIG. 2B). As for the first etching, either dry etching or wet etching may be used.

Figure 2C:
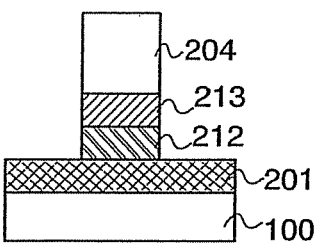

Second etching is performed by dry etching with the mask 204 left to process the second conductive layer 202. In this dry etching, the etching rate of the second conductive layer 202 is set higher than that of the first conductive layer 201. In such a manner, a second conductive layer 212 is formed (FIG. 2C).

Figure 2D:
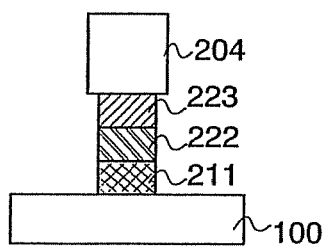
Figure 2E:
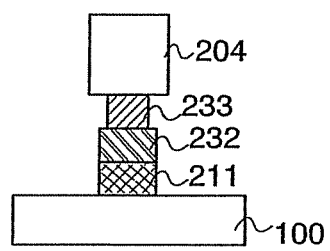
Figure 2F:
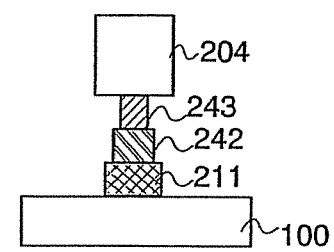

Third etching is performed by wet etching with the mask 204 left to process the first conductive layer 201. In this wet etching, the etching rate of the second conductive layer 212 is set equal to or higher than that of the first conductive layer 201 and equal to or lower than that of the third conductive layer 213. In such a manner, a wiring with a stack of a third conductive layer 223, a second conductive layer 222, and a first conductive layer 211 (FIG. 2D); a wiring with a stack of a third conductive layer 233, a second conductive layer 232, and the first conductive layer 211 (FIG. 2E); or a wiring with a stack of a third conductive layer 243, a second conductive layer 242, and the first conductive layer 211 (FIG. 2F) is formed. In the wet etching, the structure of FIG. 2D is obtained when each etching rate of the third conductive layer 213, the second conductive layer 212, and the first conductive layer 201 is the same. In the wet etching, the structure of FIG. 2E is obtained when the etching rate of the third conductive layer 213 is higher than that of the second conductive layer 212 and when each etching rate of the second conductive layer 212 and the first conductive layer 201 is the same. In the wet etching, the structure of FIG. 2F is obtained when the etching rate of the third conductive layer 213 is higher than that of the second conductive layer 212 and when the etching rate of the second conductive layer 212 is higher than that of the first conductive layer 201.

Thereafter, the mask 204 is removed.

In addition, the amount to be etched in a direction parallel to the insulating surface through the wet etching can be reduced by making the thickness of the first conductive layer 201 thinner than that of the second conductive layer 202. In such a manner, the processing accuracy of wirings can be further improved.

The processing accuracy of wirings can be further improved by making the thickness of the second conductive layer 202 five times or more, preferably 10 times or more, than that of the first conductive layer 201, for example. In addition, the thickness of the second conductive layer 202 can be 300 nm to 7 μm.

In Embodiment Mode 2, the first etching for etching the third conductive layer 203 is preformed before performing the second etching (dry etching) and the third etching (wet etching). However, the present invention is not limited thereto and can also be applied to a structure in which the third conductive layer 203 is processed by being etched after further forming a conductive layer over the third conductive layer and processing the conductive layer by being etched.

Embodiment Mode 3

Embodiment Mode 3 will explain specific examples of the materials of the first conductive layer and the second conductive layer in Embodiment Mode 1 and Embodiment Mode 2.

The first conductive layer can be formed using a nitride film of titanium (Ti), molybdenum (Mo), tungsten (NY), tantalum (Ta), or alloy thereof.

Materials such as one containing aluminum as the main component can be used as the second conductive layer.

As for the materials containing aluminum as the main component, any one of pure aluminum; aluminum alloy with silicon (Si), titanium (Ti), neodymium (Nd), or scandium (Sc); or a material in which aluminum is added with one or more elements of nickel (Ni), molybdenum (Mo), and carbon (C) may also be used. Alternatively, a stack of these materials may also be used.

The third conductive layer in Embodiment Mode 2 can be formed using a nitride film of titanium (Ti), molybdenum (Mo), tungsten (W), tantalum (Ta), or alloy thereof.

Embodiment Mode 4

Embodiment Mode 4 will explain the case of Embodiment Mode 1 and Embodiment Mode 2 where molybdenum is used as the material of the first conductive layer and a material containing aluminum as the main component is used as the material of the second conductive layer.

As for the materials containing aluminum as the main component, any one of pure aluminum; aluminum alloy with silicon (Si), titanium (Ti), neodymium (Nd), or scandium (Sc); or a material in which aluminum is added with one or more elements of nickel (Ni), molybdenum (Mo), and carbon (C) may also be used. Alternatively, a stack of these materials may also be used.

In dry-etching the second conductive layer (corresponding to the first etching in Embodiment Mode 1 and to the second etching in Embodiment Mode 2), a chlorine-based gas can be used. At least one gas of $Cl_2$, $BCl_3$, $SiCl_4$, and $CCl_4$ can be used as the chlorine-based gas.

In wet-etching the first conductive layer (corresponding to the second etching in Embodiment Mode 1 and to the third etching in Embodiment Mode 2), which is performed by using a mixed solution containing phosphoric acid and nitric acid, it is found that a concentration ratio of the phosphoric acid to the nitric acid, that is, (the phosphoric acid/the nitric acid)×100(%) is sufficiently set at 70% or more. The condition for this wet etching is explained with reference to a graph of FIG. 3.

Figure 3:
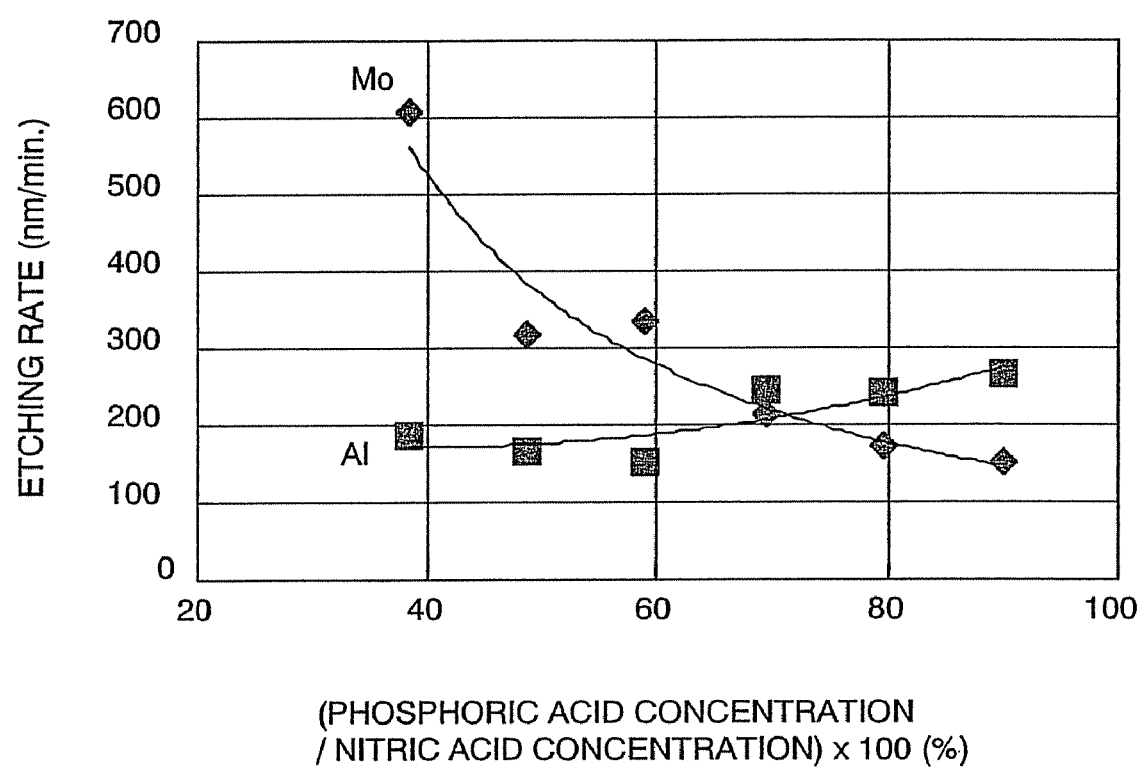
FIG. 3 is a graph showing Embodiment Mode 4.

FIG. 3 is a graph showing the relationship between a concentration ratio of the phosphoric acid to the nitric acid in a mixed solution containing phosphoric acid and nitric acid, that is, (phosphoric acid concentration/nitric acid concentration)×100(%) and the etching rate (nm/min), regarding materials each containing molybdenum (referred to as Mo in the graph) and aluminum (referred to as Al in the graph) as the main component. Note that the temperature of the mixed solution is 40° C. As is apparent from FIG. 3, the etching rate of the material containing aluminum as the main component can be set higher than that of molybdenum when the concentration ratio of the phosphoric acid to the nitric acid is 70% or more.

Therefore, the etching rate of the second conductive layer can be set equal to or higher than that of the first conductive layer by making the concentration ratio of the phosphoric acid to the nitric acid be 70% or more.

The relationship between the temperature of the mixed solution and the etching rate in the case where the concentration ratio of the phosphoric acid to the nitric acid is constant will be explained with reference to FIG. 4.

Figure 4:
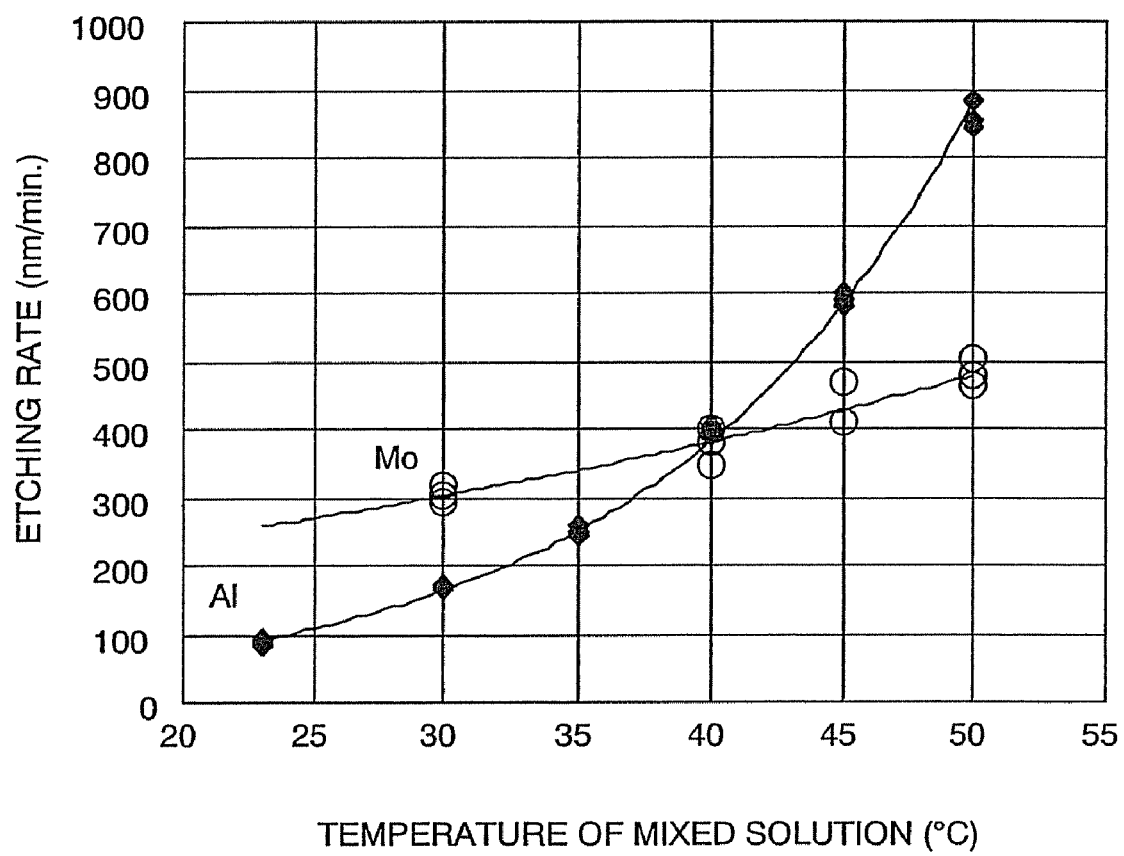
FIG. 4 is a graph showing Embodiment Mode 4.

FIG. 4 is a graph showing the relationship between the temperature (° C.) of the mixed solution containing phosphoric acid and nitric acid and the etching rate (nm/min.), regarding materials each containing molybdenum (referred to as Mo in the graph) and aluminum (referred to as Al in the graph) as the main component. As is apparent from FIG. 4, the etching rate of the material containing aluminum as the main component can be set higher than that of the molybdenum when the temperature of the mixed solution is approximately 40° C. or more.

Therefore, the etching rate of the second conductive layer can be set equal to or higher than that of the first conductive layer in the wet etching of the first conductive layer by having 70% or more of the concentration ratio of the phosphoric acid to the nitric acid, that is, (phosphoric acid concentration/nitric acid concentration)×100(%) and by making the mixed solution be approximately 40° C. or more.

Embodiment Mode 5

Embodiment Mode 5 will explain an example of a semiconductor device manufactured by using the present invention.

It is necessary to form a wiring connected to a thin film transistor minutely and with high accuracy. In addition, since the thin film transistor is formed over an insulating surface, especially dielectric breakdown due to charge generated during the manufacture becomes a problem. According to the present invention, a wiring having a minute and preferable shape can be formed without causing the damage such as dielectric breakdown. Therefore, the present invention is effective especially in the case of forming a wiring connected to a thin film transistor.

An example of a wiring connected to a thin film transistor will be explained with reference to FIGS. 5A to 5G.

Figure 5A:
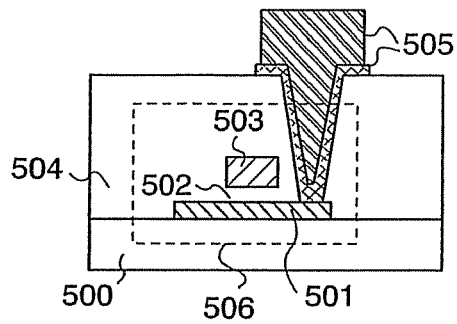
FIGS. 5A to 5G are views each showing Embodiment Mode 5.

In FIG. 5A, reference numeral 500 denotes an insulating surface; 501, a semiconductor layer; 502, a first insulating film; 503, a first wiring; 504, a second insulating film; and 505, a second wiring. In addition, reference numeral 506 denotes a thin film transistor, which includes the semiconductor layer 501, a portion of the first wiring 503 overlapped with the semiconductor layer 501, and a portion of the first insulating film 502 sandwiched between the first wiring 503 and the semiconductor layer 501. The portion of the first wiring 503 overlapped with the semiconductor layer 501 is to be a gate electrode of the thin film transistor 506, and the portion of the first insulating film 502 sandwiched between the first wiring 503 and the semiconductor layer 501 is to be a gate insulating film of the thin film transistor 506. The second wiring 505 is connected to the semiconductor layer 501 of the thin film transistor 506 through a contact hole provided in the second insulating film 504.

The insulating surface 500 may also be a surface of an insulating substrate made of glass, quartz, resin, or the like may also be a surface of a base film provided over such an insulating substrate, may also be a surface of a base film provided over a conductive substrate, or may also be a surface of an insulating film provided over a semiconductor substrate.

The first wiring 503 or the second wiring 505 is a wiring that is connected to the thin film transistor 506.

Although FIG. 5A shows a wiring formed of a two-layer stack as the second wiring 505, without being limited thereto, a multilayer wiring can be formed. A second conductive layer (upper layer) of the second wiring 505 can be formed in a thickness of 300 nm to 7 μm.

Figure 5B:
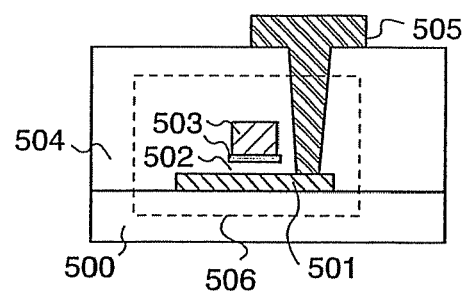

Although FIG. 5B shows a wiring formed of a two-layer stack as a first wiring 503, without being limited thereto, a multilayer wiring can be formed. A second conductive layer (upper layer) of the first wiring 503 can be formed in a thickness of 300 nm to 2 μm.

Figure 5C:
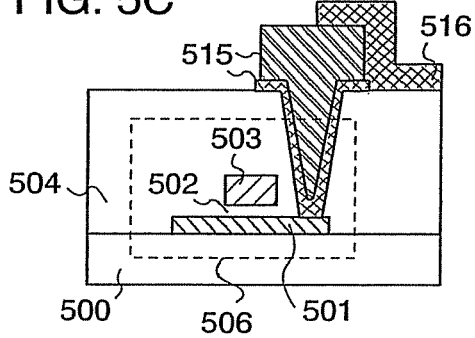

In FIG. 5C, portions identical to those in FIGS. 5A and 5B are denoted by the same reference numerals and the descriptions are omitted. Reference numeral 515 denotes a second wiring; and 516, a third wiring. The second wiring 515 is connected to a semiconductor layer 501 of a thin film transistor 506 through a contact hole provided in a second insulating film 504. The third wiring 516 is connected to the second wiring 515 and to the semiconductor layer 501. Note that the mere expression of connection includes electrical connection.

A first wiring 503, the second wiring 515, or the third wiring 516 is a wiring that is connected to the thin film transistor 506.

Although FIG. 5C shows a wiring formed of a two-layer stack as the second wiring 515, without being limited thereto, a multilayer wiring can be formed. A second conductive layer (upper layer) of the second wiring 515 can be formed in a thickness of 300 nm to 7 μm.

Figure 5D:
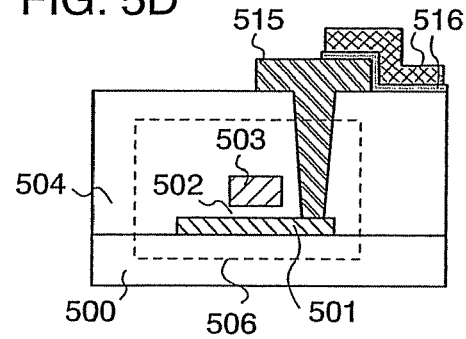

Although FIG. 5D shows a wiring formed of a two-layer stack as third wiring 516, without being limited thereto, a multilayer wiring can be formed. A second conductive layer (upper layer) of the third wiring 516 can be formed in a thickness of 300 nm to 2 μm.

Figure 5E:
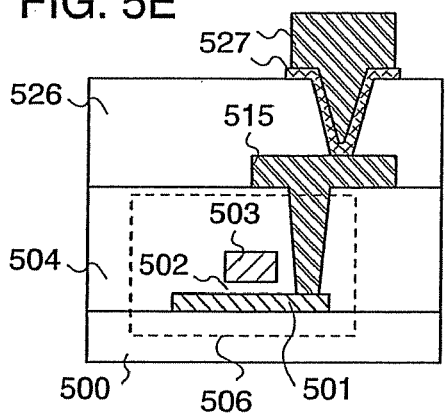

In FIG. 5E, portions identical to those in FIGS. 5A to 5D are denoted by the same reference numerals and the descriptions are omitted. Reference numeral 527 denotes a third wiring; and 526, a third insulating film. A second wiring 515 is connected to a semiconductor layer 501 of a thin film transistor 506 through a contact hole provided in a second insulating film 504. The third wiring 527 is connected to the second wiring 515 through a contact hole provided in the third insulating film 526 and to the semiconductor layer 501. Note that the mere expression of connection includes electrical connection.

A first wiring 503, the second wiring 515, or the third wiring 527 is a wiring that is connected to the thin film transistor 506.

Although FIG. 5E shows a wiring formed of a two-layer stack as the third wiring 527, without being limited thereto, a multilayer wiring can be formed. A second conductive layer (upper layer) of the third wiring 527 can be formed in a thickness of 300 nm to 7 μm.

Figure 5F:
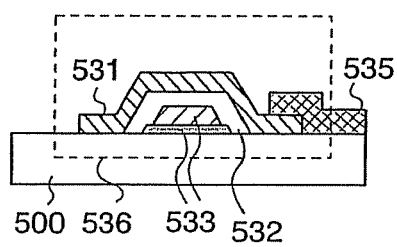

In FIG. 5F, reference numeral 500 denotes an insulating surface; 533, a first wiring; 532, a first insulating film; 531, a semiconductor layer; and 535, a second wiring. In addition, reference numeral 536 denotes a thin film transistor, which includes the semiconductor layer 531, a portion of the first wiring 533 overlapped with the semiconductor layer 531, and a portion of the first insulating film 532 sandwiched between the first wiring 533 and the semiconductor layer 531. The portion of the first wiring 533 overlapped with the semiconductor layer 531 is to be a gate electrode of the thin film transistor 536, and the portion of the first insulating film 532 sandwiched between the first wiring 533 and the semiconductor layer 531 is to be a gate insulating film of the thin film transistor 536. The second wiring 535 is connected to the semiconductor layer 531 of the thin film transistor 536.

The first wiring 533 or the second wiring 535 is a wiring that is connected to the thin film transistor 536.

Although FIG. 5F shows a wiring formed of a two-layer stack as the first wiring 533, without being limited thereto, a multilayer wiring can be formed. A second conductive layer (upper layer) of the first wiring 533 can be formed in a thickness of 300 nm to 5 μm.

Figure 5G:
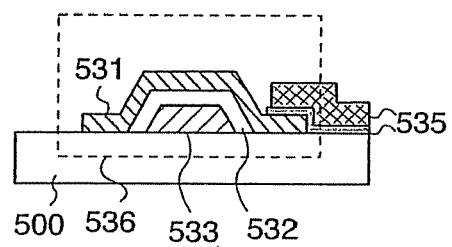
Figure 6A:
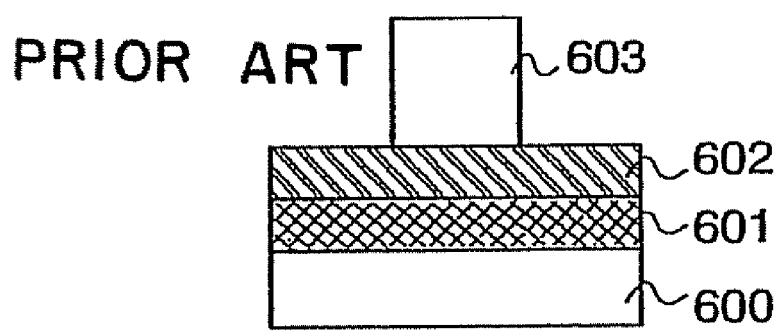
FIGS. 6A to 6C are views each showing a conventional example.
Figure 6B:
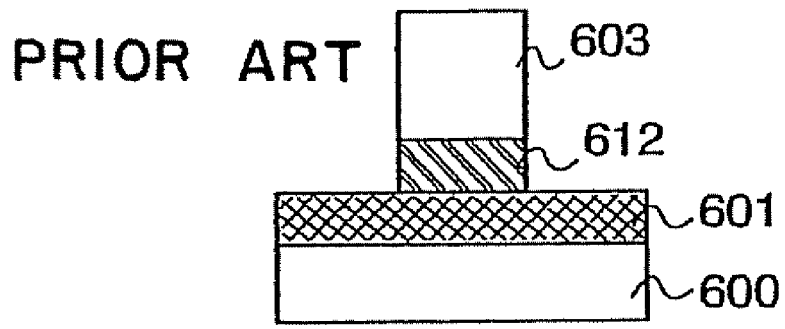
Figure 6C:
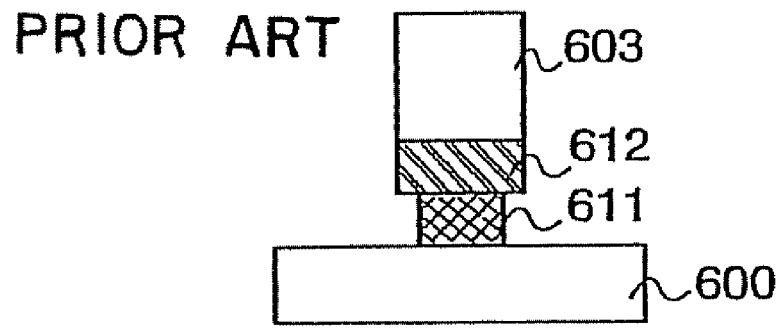

Although FIG. 5G shows a wiring formed of a two-layer stack as a second wiring 535, without being limited thereto, a multilayer wiring can be formed. A second conductive layer (upper layer) of the second wiring 535 can be formed in a thickness of 300 nm to 7 μm.

This embodiment mode is enabled by arbitrarily combining with Embodiment Mode 1 to Embodiment Mode 4.

Embodiment 1

This embodiment will explain a specific manufacturing method of a wiring in the case of Embodiment Mode 3 and Embodiment Mode 4 where molybdenum is used for the first conductive layer and a material containing aluminum as the main component is used for the second conductive layer.

Molybdenum of the first conductive layer is formed over an insulating surface in a thickness of 10 nm to 300 nm, preferably 50 nm to 150 nm. In this embodiment, molybdenum of the first conductive layer is formed in 100 nm thick. A material containing aluminum as the main component of the second conductive layer is formed over the first conductive layer in a thickness of 300 nm to 5 μm, preferably 500 nm to 1 μm. In this embodiment, aluminum of the second conductive layer is formed in 700 nm thick.

A resist mask is formed over the second conductive layer to perform dry etching using a $BCl_3$ gas and a $Cl_2$ gas. In the dry etching, it is preferable to set a ratio (selectivity) of the etching rate of aluminum to the etching rate of molybdenum at 10 or more.

As for the dry etching, ICP (Inductively Coupled Plasma) etching apparatus is used. The ICP etching apparatus can control plasma easily and can respond even in the case of a large-sized processing substrate. In this embodiment, E645 manufactured by Matsushita Electric Industrial Co., Ltd. is used as the ICP etching apparatus. A gas flow rate is set at $BCl_3/Cl_2=60/20$ sccm; a gas pressure, 1.9 Pa; an ICP power, 450 W; and a bias power, 100 W. An etching time (207 sec.) which is a just etching time (147 sec.) added with an over etching time is set as the processing time.

The ratio (selectivity) of the etching rate of aluminum to the etching rate of molybdenum can be set at 30 or more by performing the dry etching under the above conditions.

Next, wet etching is performed by using a mixed solution containing phosphoric acid and nitric acid, with the mask left. In the above mixed solution, the concentration ratio of the phosphoric acid to the nitric acid is set at 70% and the temperature of the solution is set at 40° C. The wet etching is performed for 30 sec.

Molybdenum can be etched with an etching rate of approximately 220 nm/min and the aluminum can be etched with an etching rate of approximately 250 nm/min by performing the wet etching under the above conditions. While processing the first conductive layer formed of molybdenum by being etched, the second conductive layer formed of aluminum is etched until its end is etched 125 nm inside of the end of the mask.

In such a manner, a stacked-wiring of the first conductive layer formed of molybdenum and the second conductive layer formed of aluminum can be formed.

Embodiment 2

A method for manufacturing a semiconductor device of the present invention can be applied to a method for manufacturing a semiconductor device that functions as a wireless chip (also referred to as a wireless processor, a wireless memory, or a wireless tag).

The wireless chip is capable of reading out and writing data without contact with an external device, and an antenna is used to transmit data.

The structure of the wireless chip is explained with reference to FIG. 9. The wireless chip is formed of a thin film integrated circuit 701 and an antenna 702 connected thereto.

The thin film integrated circuit 701 is formed by using elements such as a thin film transistor, a memory element, a diode, a photoelectric conversion element, a resistance element, a coil, and/or a capacitor element. The present invention can be applied to a method for manufacturing a wiring connected to these elements. FIG. 9 shows a thin film transistor 703 as an example of the element included in the thin film integrated circuit 701.

Figure 9:
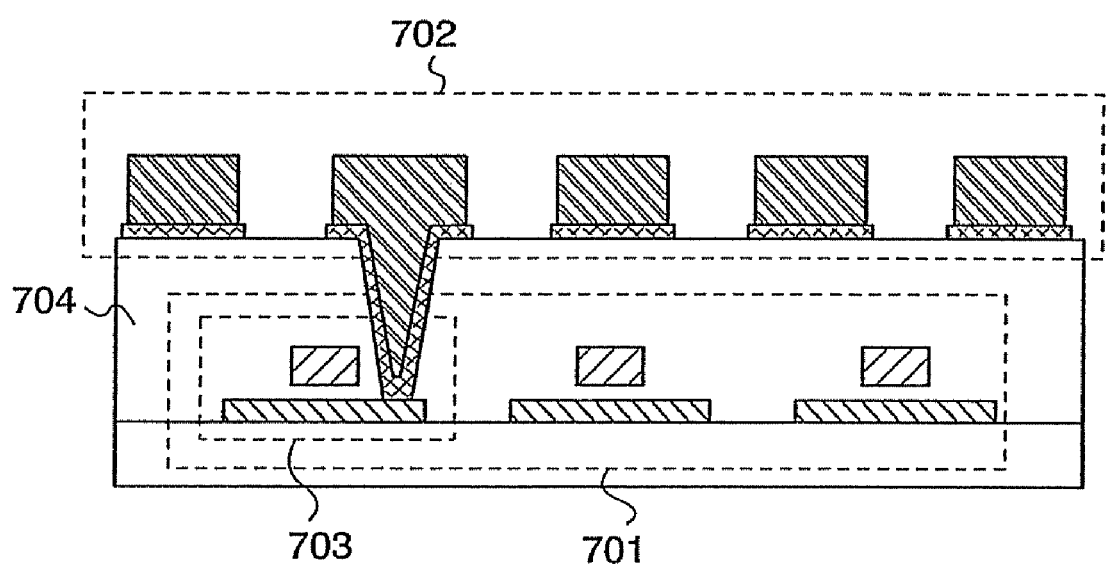
FIG. 9 is a view showing Embodiment 2.

As shown in FIG. 9, an interlayer insulating film 704 is formed over the thin film integrated circuit 701. The antenna 702 connected to the thin film transistor 703 through a contact hole is formed in the interlayer insulating film 704.

The present invention can be applied to a method for manufacturing the antenna 702. The present invention is especially effective in the case of forming the antenna 702 by processing a conductive layer each connected to the elements (the thing film transistors 703 in FIG. 9) of the thin film integrated circuit 701 by being etched.

Although FIG. 9 shows a wiring formed of a two-layer stack as the antenna 702, without being limited thereto, a multilayer wiring can be formed. A second conductive layer (upper layer) of the antenna 702 can be formed in a thickness of 3 μm to 7 μm.

In addition, a barrier formed of a silicon nitride film or the like may also be formed over the interlayer insulating film 704 and the antenna 702. The antenna 702 can have a preferable shape by using a method for manufacturing a wiring of the present invention; therefore, the adhesiveness between the antenna 702 and the barrier film formed over the antenna 702 can be increased and reliability of a semiconductor device can be enhanced.

In the structure shown in FIG. 9, the antenna 702 is provided over the interlayer insulating film 704. This structure corresponds to the case where the antenna 702 is formed by using a second wiring 505 shown in FIG. 5A. However, the present invention is not limited to the above structure. It is also possible to form the antenna by using, for example, a first wiring 503 of FIG. 5A, a first wiring 503 of FIG. 5B, a second wiring 505 of FIG. 5B, a first wiring 503 of FIG. 5C, a second wiring 515 of FIG. 5C, a third wiring 516 of FIG. 5C, a first wiring 503 of FIG. 5D, a second wiring 515 of FIG. 5D, a third wiring 516 of FIG. 5D, a first wiring 503 of FIG. 5E, a second wiring 515 of FIG. 5E, a third wiring 527 of FIG. 5E, a first wiring 533 of FIG. 5F, a second wiring 535 of FIG. 5F, a first wiring 533 of FIG. 5, or a second wiring 535 of FIG. 5G.

The application of a wireless chip ranges extensively. A wireless chip can be used by being provided for, for example, an article of a commodity such as a bill, a coin, securities, bearer bonds, certificates (a driver's license, a residence certificate, or the like), wrapping items (wrapping paper, a bottle, or the like), a recording medium (DVD software, a video tape, or the like), vehicles (a bicycle or the like), accessories (a bag, glasses, or the like), foodstuffs, plants, creatures, human bodies, clothes, living wares, or an electronic device, or an article such as a luggage tug of a baggage.

This embodiment is enabled by arbitrarily combining with the embodiment modes and Embodiment 1.

Embodiment 3

Figure 10A:
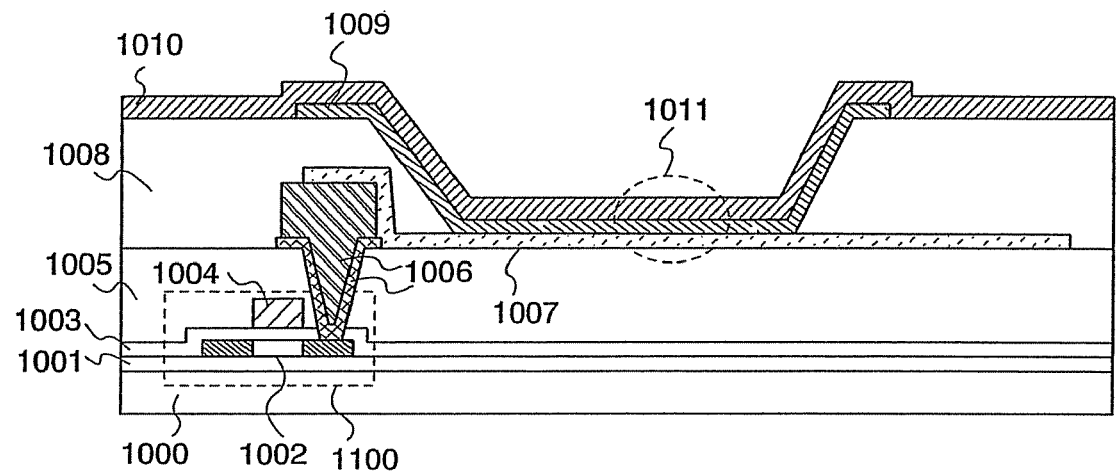
FIGS. 10A and 10B are views each showing Embodiment 3.
Figure 10B:
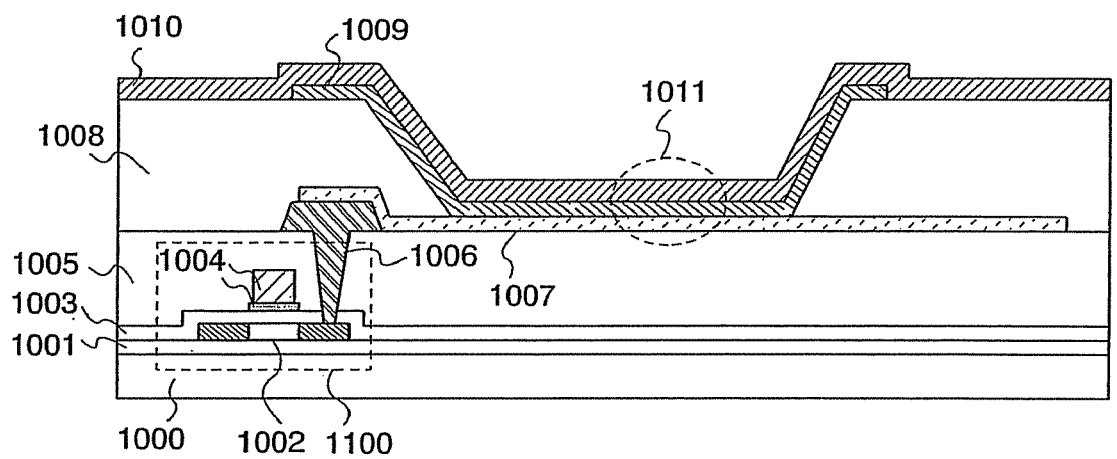

A method for manufacturing a semiconductor device of the present invention can be applied to a method for manufacturing a display device. FIGS. 10A and 10B each show a cross-sectional view of a pixel included in a display device manufactured by using the present invention.

In each of FIGS. 10A and 10B, reference numeral 1000 denotes a substrate; 1001, a base film; 1002, a semiconductor layer; 1003, a first insulating film; 1004, a gate electrode; 1005, a second insulating film; 1006, an electrode; 1007, a first electrode; 1008, a third insulating film; 1009, a light-emitting layer; and 1010, a second electrode. In addition, reference numeral 1100 denotes a thin film transistor; and 1011, a light-emitting element.

As for the substrate 1000, for example, a glass substrate such as a barium borosilicate glass substrate or an alumino borosilicate glass substrate, a quartz substrate, a ceramic substrate, or the like can be used. In addition, a substrate of metal including stainless steel or a semiconductor substrate in each of which an insulating film is formed over the surface may also be used. Alternatively, a flexible substrate made of synthetic resin such as plastic may also be used. Moreover, the surface of the substrate 1000 may also be planarized by polishing with a CMP method or the like.

The base film 1001 can be formed by using an insulating film such as silicon oxide, silicon nitride, or silicon nitride oxide. The base film 1001 can prevent alkaline metal such as Na or alkaline earth metal contained in the substrate 1000 from diffusing into the semiconductor layer 1002 and from exerting a harmful influence on the characteristics of the thin film transistor 1100. Although FIGS. 10A and 10B each have the base film 1001 with a single structure, the base film 1001 may also be formed of two layers or a multilayer including two or more layers. Note that the base film 1001 is not necessarily required to be provided in the case of using a quartz substrate or the like in which diffusion of impurities scarcely happens.

A crystalline semiconductor film or an amorphous semiconductor film that is processed by being etched into an arbitrary shape can be used as the semiconductor layer 1002. A crystalline semiconductor film can be obtained by crystallizing an amorphous semiconductor film. As for a crystallization method, a laser crystallization method, a thermal crystallization method using RTA or an annealing furnace, a thermal crystallization method using a metal element that promotes crystallization, or the like can be used. The semiconductor layer 1002 has a channel-forming region and a pair of impurity regions each added with an impurity element imparting conductivity. Note that an impurity region added with the impurity element so as to form a low-concentration region may also be formed between the channel-forming region and the pair of impurity regions.

The first insulating film 1003 can be formed with a single layer or in a stack of a plurality of films by using silicon oxide, silicon nitride, silicon nitride oxide, or the like.

The gate electrode 1004 can be formed with a single-layer or stacked structure by using one element of Ta, W, Ti, Mo, Al, Cu, Cr, and Nd, or alloy or a compound containing a plurality of the elements.

As shown in FIG. 10B, in the case of using a method for manufacturing a wiring of the present invention for the gate electrode 1004 and a wiring formed concurrently with the gate electrode 1004, the gate electrode 1004 is required to have a stacked structure of two or more layers.

The thin film transistor 1100 has the semiconductor layer 1002, the gate electrode 1004, and the first insulating film 1003 between the semiconductor layer 1002 and the gate electrode 1004. In FIGS. 10A and 10B, only the thin film transistor 1100 connected to the first electrode 1007 of the light-emitting element 1011 is shown as a thin film transistor included in a pixel; however, a pixel may also have a plurality of thin film transistors. In addition, although this embodiment shows the thin film transistor 1100 as a top-gate type transistor, the thin film transistor may also be a bottom-gate type transistor having a gate electrode below a semiconductor layer or a dual-gate type transistor having gate electrodes both over and below a semiconductor layer.

The second insulating film 1005 can be formed by using a single layer or a stack of an inorganic insulating film or an organic insulating film. As for the inorganic insulating film, a silicon oxide film formed by a CVD method, a silicon oxide film formed by an SOG (Spin-On-Glass) method, or the like can be used. As for the organic insulating film, a film such as polyimide, polyamide, BCB (benzocyclobutene), acrylic, or a positive photosensitive organic resin or a negative photosensitive organic resin can be used.

In addition, the second insulating film 1005 can also be formed by using a material composed of a skeleton structure formed by the bond of silicon (Si) and oxygen (O). In the material, an organic group at least containing hydrogen (such as an alkyl group or aromatic hydrocarbon) can be used as a substituent. Further, a fluoro group may also be used as the substituent. Alternatively, an organic group at least containing hydrogen and a fluoro group may also be used as the substituent.

The electrode 1006 can be formed by using a single-layer or stacked structure of a film composed of one element of Al, W. Mo, Ti, Pt, Cu, Ta, and Au or a film composed of alloy containing a plurality of the elements. Further, the electrode 1006 may have a single-layer or stacked structure of a film composed of alloy containing one or at least one of the elements and at least one or at least one element of Ni, C, and Mn.

As shown in FIG. 10A, in the case of using a method for manufacturing a wiring of the present invention for the electrode 1006 and a wiring formed concurrently with the electrode 1006, it is necessary to form the electrode 1006 by using a stacked structure of two or more layers. For example, a stack of Mo and Al over the Mo, a stack of Mo, Al over the Mo, and Mo over the Al, or the like can be used as the electrode 1006.

One or both the first electrode 1007 and the second electrode 1010 can be transparent electrodes. As for the transparent electrode, indium tin oxide (ITO), zinc oxide (ZnO), indium zinc oxide (IZO), zinc oxide added with gallium (GZO), or the like can be used as well as another light-transmitting oxide conductive material. The following may also be used as the light-transmitting oxide conductive material: ITO and indium tin oxide containing silicon oxide (hereinafter, referred to as ITSO); ITO and indium tin oxide containing titanium oxide (hereinafter, referred to as ITTO); ITO and indium tin oxide containing molybdenum oxide (hereinafter, referred to as ITMO); ITO added with titanium, molybdenum, or gallium; or a material formed by using a target in which indium oxide, containing silicon oxide, is further added with zinc oxide (ZnO) of 2 to 20 wt %.

The other of the first electrode 1007 and the second electrode 1010 may also be formed with a material without light-transmitting properties. For example, rare-earth metal such as Yb or Er can be used besides alkali metal such as Li or Cs; alkaline earth metal such as Mg, Ca, or Sr; alloy containing these metals (Mg:Ag, Al:Li, Mg:In, or the like), and a compound of these metals (calcium fluoride such as $CaF_2$ or calcium nitride).

The third insulating film 1008 can be formed by using the same material as that of the second insulating film 1005. The third insulating film 1008 is formed in the periphery of the first electrode 1007 so that the end of the first electrode 1007 is covered. In addition, the third insulating film 1008 has a function to separate the light-emitting layer 1009 in neighboring pixels.

The light-emitting layer 1009 is formed of a single layer or a multilayer. In the case of a multilayer, these layers can be classified into a hole-injecting layer, a hole-transporting layer, a light-emitting layer, an electron-transporting layer, an electron-injecting layer, or the like in terms of carrier transportability. Note that a border of each layer does not always have to be definite, and sometimes a material for forming each layer is partially mixed, and thus, an interface may be indefinite. It is possible to use an organic-based material or an inorganic-based material for each layer. A for the organic-based material, any one of a high molecular weight material, a middle molecular weight material, and a low molecular weight material can be used.

The light-emitting element 1011 is composed of the light-emitting layer 1009, and the first electrode 1007 and the second electrode 1010 overlapped with the light-emitting layer 1009 therebetween. One of the first electrode 1007 and the second electrode 1010 corresponds to an anode, and the other corresponds to a cathode. The light-emitting element 1011 emits light after current flows from the anode to the cathode when voltage higher than the threshold voltage is applied between the anode and the cathode under forward bias.

This embodiment is enabled by arbitrarily combining with the embodiment modes or Embodiment 1.

Embodiment 4

Figure 11A:
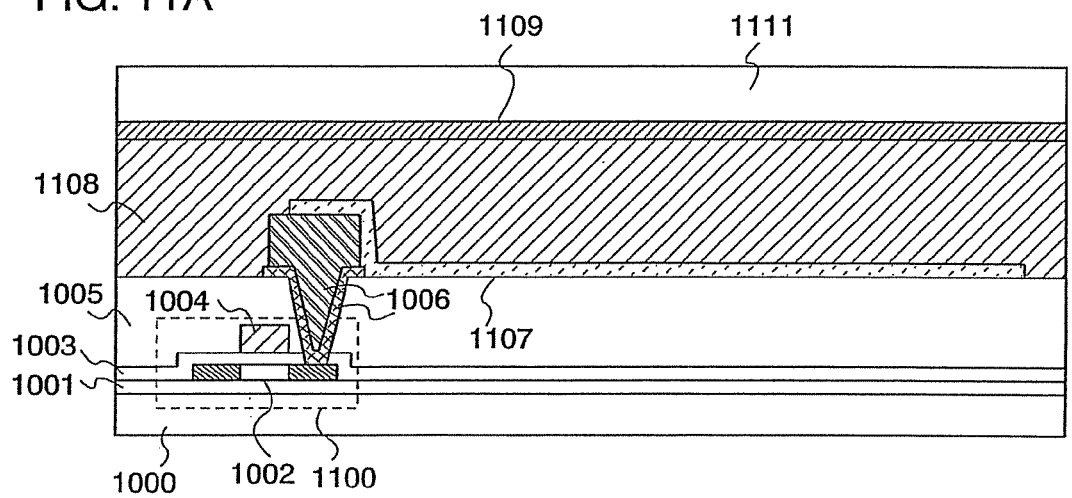
FIGS. 11A and 11B are views each showing Embodiment 4.
Figure 11B:
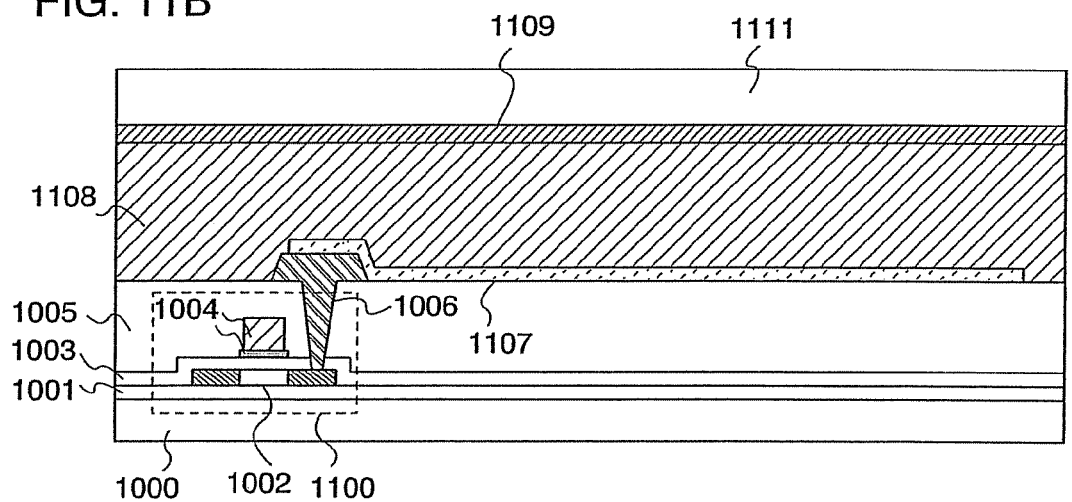

A method for manufacturing a semiconductor device of the present invention can be applied to a method for manufacturing a display device. An example that differs from the structure shown in Embodiment 3 will be shown. FIGS. 11A and 11B each show a cross-sectional view of a pixel included in a display device manufactured by using the present invention. Note that portions identical to those in FIGS. 10A and 10B are denoted by the same reference numerals and the descriptions are omitted.

FIG. 11A is an example in the case of using a method for manufacturing a wiring of the present invention for an electrode 1006 and a wiring formed concurrently with the electrode 1006. FIG. 11B is an example in the case of using a method for manufacturing a wiring of the present invention for a gate electrode 1004 and a wiring formed concurrently with the gate electrode 1004.

In FIGS. 11A and 11B, reference numeral 1107 denotes a first electrode; 1108, a liquid crystal; 1109, a second electrode; and 1111, a substrate. The liquid crystal 1108 is sandwiched between a substrate 1000 and the substrate 1111. An alignment film may also be provided between the first electrode 1107 and the liquid crystal 1108. In addition, the alignment film may also be provided between the second electrode 1109 and the liquid crystal 1108.

As for the substrate 1111, for example, a glass substrate such as a barium borosilicate glass substrate or an alumino borosilicate glass substrate, or a quartz substrate can be used. In addition, a flexible substrate made of synthetic resin such as plastic may also be used. The surface of the substrate 1000 may also be planarized by polishing with a CMP method or the like.

One or both the first electrode 1107 and the second electrode 1109 can be transparent electrodes. As for the transparent electrode, indium tin oxide (ITO), zinc oxide (ZnO), indium zinc oxide (IZO), zinc oxide added with gallium (GZO), or the like can be used as well as another light-transmitting oxide conductive material. ITSO, ITTO, or ITMO can also be used as the light-transmitting oxide conductive material. Further, ITO added with titanium, molybdenum, or gallium; or a material formed by using a target in which indium oxide, containing silicon oxide, is further added with zinc oxide (ZnO) of 2 to 20 wt % may also be used.

In the case of a reflective type liquid crystal display device, the other of the first electrode 1007 and the second electrode 1109 may also be formed with a material without light-transmitting properties. For example, rare-earth metal such as Yb or Er can be used besides alkali metal such as Li or Cs; alkaline earth metal such as Mg, Ca, Sr, or alloy containing these metals (Mg:Ag, Al:Li, Mg:In, or the like), or a compound of these metals (calcium fluoride such as $CaF_2$ or calcium nitride).

A known liquid crystal can be used for the liquid crystal 1108. In addition, a TN (Twisted Nematic) mode, an MVA (Multi-domain Vertical Alignment) mode, an OCB (Optical Compensated Bend) mode, or the like can be used arbitrarily as a mode of the display device.

Note that FIGS. 11A and 11B each show an example in which the first electrode 1107 is disposed over the substrate 1000 and the second electrode 1109 is disposed over the substrate 1111. However, without being limited thereto, the display device may also have a structure for driving the liquid crystal with an IPS (In-Plane-Switching) mode by providing both the first electrode 1107 and the second electrode 1109 over the substrate 1000.

The alignment state of the liquid crystal 1108 is controlled due to an electric field formed by the first electrode 1107 and the second electrode 1109; thus, the transmission of the liquid crystal 1108 is changed to display.

This embodiment is enabled by arbitrarily combining with the embodiment modes, Embodiment 1, or Embodiment 3.

Embodiment 5

A method for manufacturing a semiconductor device of the present invention can be applied to a method for manufacturing a memory circuit.

Figure 12A:
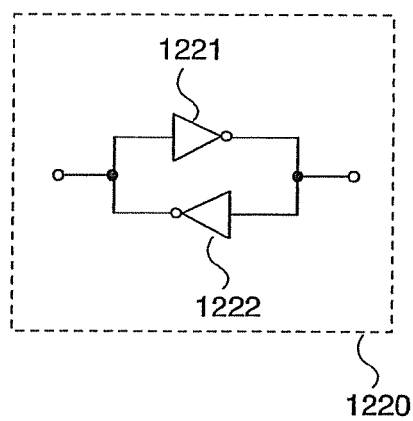
FIGS. 12A to 12C are views each showing Embodiment 5.
Figure 12B:
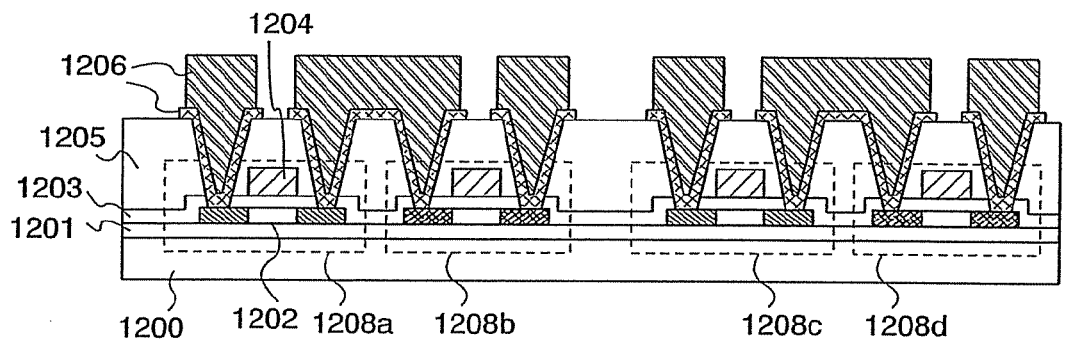
Figure 12C:
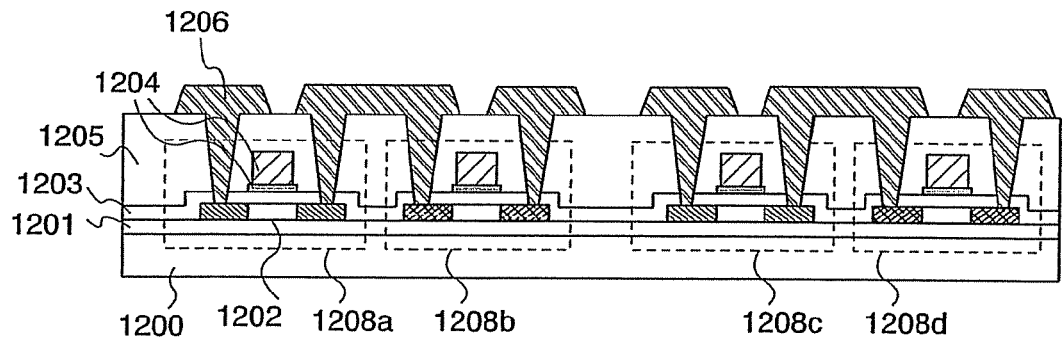

FIGS. 12A to 12C each show part of an example of a memory circuit manufactured by using the present invention. The figures each show an example using a flip-flop (a bistable circuit) as the memory circuit.

FIG. 12A is a circuit diagram of a flip-flop 1220 composed of two inverter circuits (an inverter circuit 1221 and an inverter circuit 1222). FIGS. 12B and 12C each show an example in which the circuit of FIG. 12A is manufactured by using the present invention.

In each of FIGS. 12B and 12C, reference numeral 1200 denotes a substrate; 1201, a base film; 1202, a semiconductor layer; 1203, a first insulating film; 1204, a gate electrode; 1205, a second insulating film; 1206, an electrode; 1208a and 1208c, N-channel thin film transistors; and 1208b and 1208d, P-channel thin film transistors.

The inverter circuit 1221 is composed of the N-channel thin film transistor 1208a and the P-channel thin film transistor 1208b. The inverter circuit 1222 is composed of the N-channel thin film transistor 1208c and the P-channel thin film transistor 1208d. The flip-flop 1220 is composed of the inverter circuit 1221 and the inverter circuit 1222.

The substrate 1200 can have the same structure as that of the substrate 1000 in FIGS. 10A and 10B or FIGS. 11A and 11B. The base film 1201 can have the same structure as that of the base film 1001 in FIGS. 10A and 10B or FIGS. 11A and 11B. The semiconductor layer 1202 can have the same structure as that of the semiconductor layer 1002 in FIGS. 10A and 10B or FIGS. 11A and 11B. The first insulating film 1203 can have the same structure as that of the first insulating film 1003 in FIGS. 10A and 10B or FIGS. 11A and 11B. The gate electrode 1204 can have the same structure as that of the gate electrode 1004 in FIGS. 10A and 10B or FIGS. 11A and 11B. The second insulating film 1205 can have the same structure as that of the second insulating film 1005 in FIGS. 10A and 10B or FIGS. 11A and 11B. The electrode 1206 can have the same structure as that of the electrode 1006 in FIGS. 10A and 10B or FIGS. 11A and 11B.

FIG. 12B is an example in the case of using a method for manufacturing a wiring of the present invention for the electrode 1206 and a wiring formed concurrently with the electrode 1206. FIG. 12C is an example in the case of using a method for manufacturing a wiring of the present invention for the gate electrode 1204 and a wiring formed concurrently with the gate electrode 1204.

The memory circuit using a flip-flop shown in this embodiment can be used for a driver circuit of the display device shown in Embodiment 3 or Embodiment 4.

Although this embodiment shows an example of a memory circuit using a flip-flop, a method for manufacturing a semiconductor device of the present invention can be applied to manufacturing memory circuits of various structures. A method for manufacturing a semiconductor device of the present invention can be applied to a method for manufacturing a SRAM (Static Random Access Memory), a DRAM (Dynamic Random Access Memory), a flash memory, or the like.

This embodiment is enabled by arbitrarily combining with the embodiment modes, Embodiment 1, Embodiment 2, Embodiment 3, or Embodiment 4.

Embodiment 6

Figure 13A:
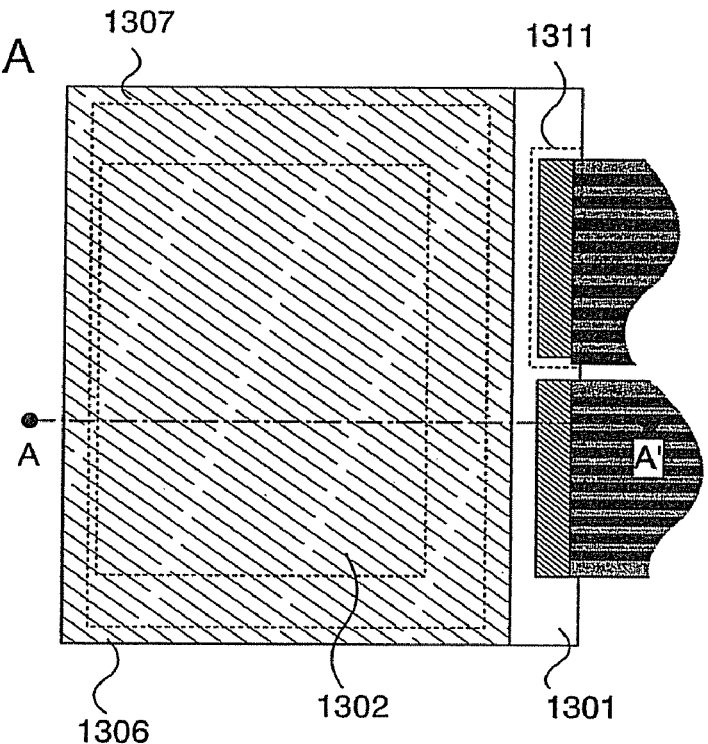
FIGS. 13A to 13C are views each showing Embodiment 6.
Figure 13B:
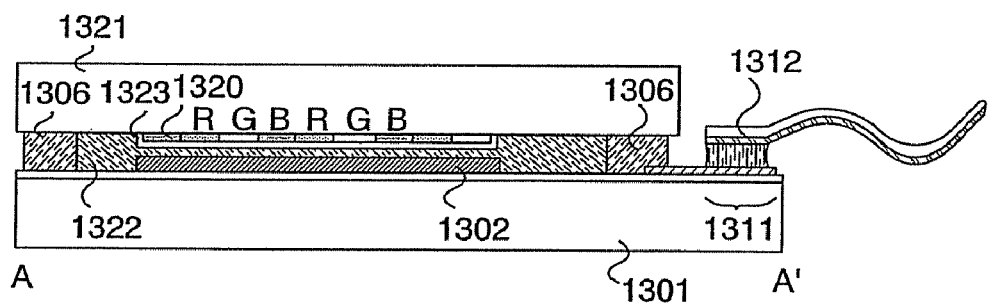
Figure 13C:
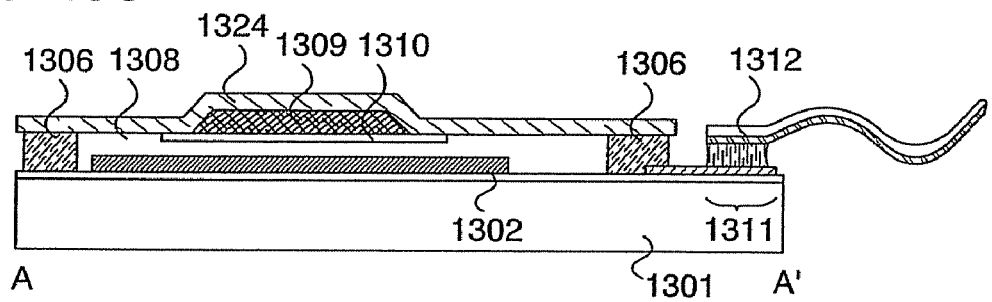

This embodiment of the present invention will be explained with reference to FIGS. 13A to 13C. FIG. 13A is a top view of a display panel formed by sealing a display device, and FIGS. 13B and 13C each show a cross-sectional view taken along A-A' of FIG. 13A. FIGS. 13B and 13C each show an example in which sealing is performed with a different method.

In FIGS. 13A to 13C, a display portion 1302 having a plurality of pixels is disposed over a substrate 1301. A sealant 1306 is provided so as to surround the display portion, and a sealing member is attached. A driver circuit for inputting a signal into the display portion 1302 may also be formed over the substrate 1301 besides the display portion 1302. As for a structure of the pixels, the structure such as the one in FIGS. 10A and 10B shown in the above Embodiment 3 can be used.

In the display panel of FIG. 13B, the sealing member 1307 of FIG. 13A corresponds to an opposite substrate 1321. The transparent opposite substrate 1321 is attached by using the sealant 1306 as an adhesive layer; thus, enclosed space 1322 is formed by the substrate 1301, the opposite substrate 1321, and the sealant 1306. The opposite substrate 1321 is provided with a color filter 1320 and a protective film 1323 for protecting the color filter. Light radiated from a light-emitting element disposed to the display portion 1302 is emitted outside through the color filter 1320. The enclosed space 1322 is filled with inactive resin, liquid, or the like. Note that light-transmitting resin in which a hygroscopic material is dispersed may also be used as the resin for filling the enclosed space 1322. In addition, the opposite substrate 1321 may also be attached concurrently with sealing the display portion 1302 by using the same material for a material of the sealant 1306 and a material that fills the enclosed space 1322.

In the display panel shown in FIG. 13C, the sealing member 1307 of FIG. 13A corresponds to a sealing member 1324. The sealing member 1324 is attached using the sealant 1306 as an adhesive layer; thus, enclosed space 1308 is formed with a substrate 1301, the sealant 1306, and the sealing member 1324. The sealing member 1324 is provided in advance with a hygroscopic material 1309 in a depression, which has a role to suppress deterioration of a light-emitting element by keeping a clean atmosphere inside the enclosed space 1308 by the adsorption of moisture, oxygen, or the like. This depression is covered with a cover member 1310 with fine mesh. The cover member 1310 let air or moisture through but not the hygroscopic material 1309. Note that it is sufficient that the enclosed space 1308 is filled with nitrogen or rare gas such as argon and it is also possible to fill with inert resin or liquid.

An input terminal portion 1311 for transmitting a signal to the display portion 1302 or the like is provided over the substrate 1301, and a data signal such as a video signal is transmitted to the input terminal portion 1311 through an FPC (flexible printed circuit) 1312. In the input terminal portion 1311, a wiring formed over the substrate 1301 and a wiring provided for the FPC 1312 are connected electrically by using resin in which conductors are dispersed (anisotropic conductive film: ACF).

This embodiment shows an example in which the present invention is applied to a light-emitting panel using a light-emitting element. However, without being limited thereto, the present invention may also be applied to a liquid crystal panel using a liquid crystal element. For example, the present invention can be applied to a liquid crystal panel using the display device shown in FIGS. 11A and 11B of Embodiment 4.

This embodiment is enabled by arbitrarily combining with the embodiment modes, Embodiment 1, Embodiment 3, Embodiment 4, or Embodiment 5.

Embodiment 7

A method for manufacturing a semiconductor device of the present invention can be applied to manufacturing various electronic devices. The following can be given as examples of the electronic devices: a camera (a video camera, a digital camera, and the like), a projector, a head mounted display (a goggle type display), a navigation system, a stereo, a personal computer, a game machine, a portable information terminal (a mobile computer, a cellular phone, an electronic book, and the like), an image reproducing device provided with the content of a recording medium (specifically, a device capable of reproducing a recording medium such as a Digital Versatile Disc (DVD) and that has a display device capable of displaying the image), a television, and the like. FIGS. 7A to 7D each show an example of the electronic devices.

Figure 7A:
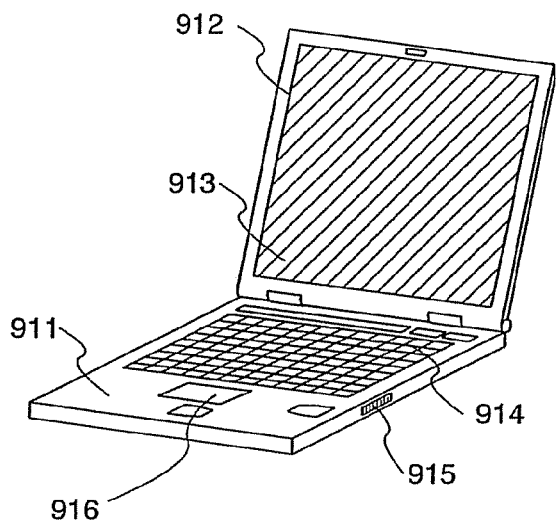
FIGS. 7A to 7D are views each showing an electronic device according to a certain aspect of the present invention.

FIG. 7A is a laptop computer, which includes a main body 911, a housing 912, a display portion 913, a key board 914, an external connection port 915, a pointing pad 916, and the like. A method for manufacturing a semiconductor device of the present invention can be applied to manufacturing the display portion 913 or the like. The display portion 913 has a structure in which a pixel or the like is fabricated in minutely over an insulating substrate such as glass or resin. The present invention is capable of preventing plasma damage caused by dry etching and forming a wiring having a preferable shape; therefore, the present invention is effective especially in manufacturing a minute wiring of the display portion 913.

Figure 7B:
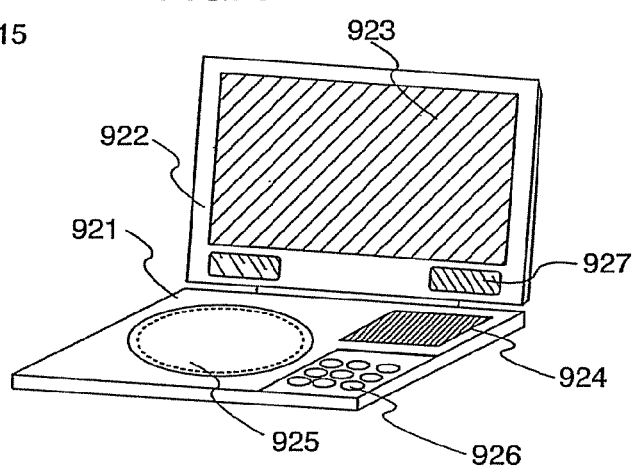

FIG. 7B is an image reproducing device provided with a recording medium (specifically, a DVD reproducing device), which includes a main body 921, a housing 922, a first display portion 923, a second display portion 924, a recording medium (DVD or the like) reading portion 925, operation keys 926, a speaker portion 927, and the like. The first display portion 923 is used mainly for displaying image information, while the second display portion 924 is used mainly for displaying text information. A method for manufacturing a semiconductor device of the present invention can be applied to manufacturing the first display portion 923 or the second display portion 924. In particular, the first display portion 923 is used mainly for displaying image information; therefore, the first display portion 923 has a structure in which a pixel or the like is fabricated in minutely over an insulating substrate such as glass or resin. The present invention is capable of preventing plasma damage caused by dry etching and forming a wiring having a preferable shape; therefore, the present invention is effective especially in manufacturing a minute wiring of the first display portion 923.

Figure 7C:
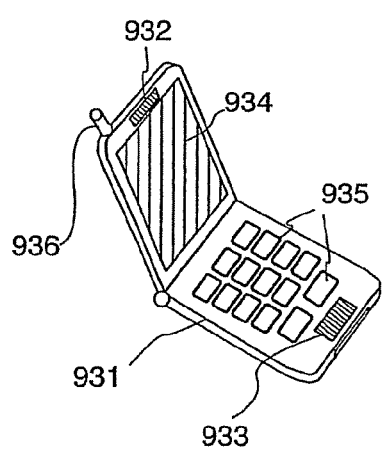

FIG. 7C is a cellular phone, which includes a main body 931, an audio output portion 932, an audio input portion 933, a display portion 934, operation switches 935, an antenna 936, and the like. A method for manufacturing a semiconductor device of the present invention can be applied to manufacturing the display portion 934 or the like. The display portion 934 has a structure in which a pixel or the like is fabricated in minutely over an insulating substrate such as glass or resin. The present invention is capable of preventing plasma damage caused by dry etching and forming a wiring having a preferable shape; therefore, the present invention is effective especially in manufacturing a minute wiring of the display portion 934.

Figure 7D:
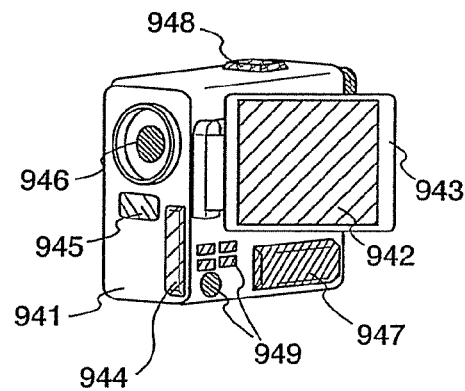
Figure 8A:
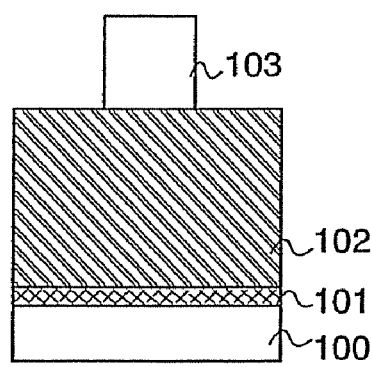
FIGS. 8A to 8D are views each showing Embodiment Mode 1.
Figure 8B:
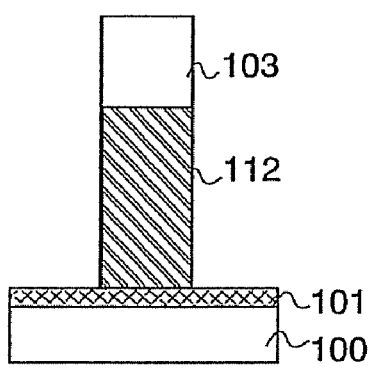
Figure 8C:
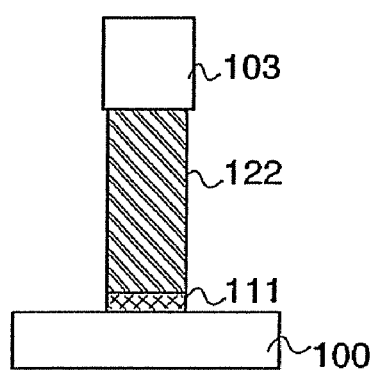
Figure 8D:
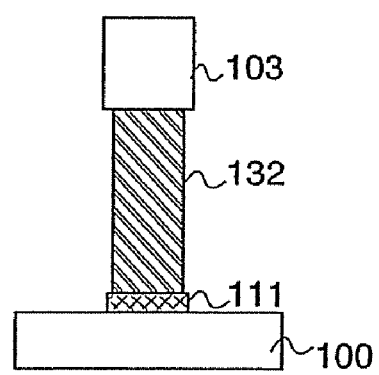

FIG. 7D is a camera, which includes a main body 941, a display portion 942, a housing 943, an external connection port 944, a remote control receiving portion 945, an image receiving portion 946, a battery 947, an audio input portion 948, operation keys 949, and the like. A method for manufacturing a semiconductor device of the present invention can be applied to manufacturing the display portion 934 or the like. The display portion 942 has a structure in which a pixel or the like is fabricated in minutely over an insulating substrate such as glass or resin. The present invention is capable of preventing plasma damage caused by dry etching and forming a wiring having a preferable shape; therefore, the present invention is effective especially in manufacturing a minute wiring of the display portion 942.

This embodiment is enabled by arbitrarily combining with the embodiment modes and Embodiment 1 to Embodiment 6.

The present application is based on Japanese Patent Application serial No. 2004-343320 filed on Nov. 29, 2004 in Japanese Patent Office, the entire contents of which are hereby incorporated by reference.

What is claimed is:

1. A method for manufacturing a semiconductor device comprising:
    forming a first conductive layer over an insulating surface;
    forming a second conductive layer over the first conductive layer;
    forming a resist mask over the second conductive layer;
    processing the second conductive layer by dry etching using the resist mask; and
    processing the first conductive layer by wet etching using the resist mask,
    wherein the second conductive layer is five times or more as thick as the first conductive layer,
    wherein an etching rate of the second conductive layer is higher than that of the first conductive layer in the dry etching, and
    wherein an etching rate of the second conductive layer is equal to or higher than that of the first conductive layer in the wet etching.

2. The method for manufacturing a semiconductor device according to claim 1, wherein the first conductive layer is a stacked layer.

3. The method for manufacturing a semiconductor device according to claim 1, wherein the second conductive layer is a stacked layer.

4. The method for manufacturing a semiconductor device according to claim 1, wherein the first conductive layer is thinner than the second conductive layer.

5. The method for manufacturing a semiconductor device according to claim 1, wherein a thickness of the second conductive layer is 300 nm to 7 μm.

6. The method for manufacturing a semiconductor device according to claim 1, wherein the first conductive layer is connected to a transistor.

7. A method for manufacturing a semiconductor device comprising:
    forming a first conductive layer containing molybdenum over an insulating surface;
    forming a second conductive layer containing a stack of aluminum and aluminum added with nickel over the first conductive layer;
    forming a resist mask over the second conductive layer;
    processing the second conductive layer by dry etching using the resist mask; and
    processing the first conductive layer by wet etching using the resist mask,
    wherein an etching rate of the second conductive layer is higher than that of the first conductive layer in the dry etching, and
    wherein an etching rate of the second conductive layer is equal to or higher than that of the first conductive layer in the wet etching.

8. A method for manufacturing a semiconductor device comprising:
    forming a first conductive layer over an insulating surface;
    forming a second conductive layer over the first conductive layer;
    forming a third conductive layer over the second conductive layer;
    forming a resist mask over the third conductive layer;
    processing the third conductive layer by first etching using the resist mask;
    processing the second conductive layer by dry etching using the resist mask; and
    processing the first conductive layer by wet etching using the resist mask,
    wherein an etching rate of the second conductive layer is higher than that of the first conductive layer in the dry etching, and
    wherein an etching rate of the second conductive layer is equal to or higher than that of the first conductive layer, and is equal to or lower than that of the third conductive layer in the wet etching.

9. The method for manufacturing a semiconductor device according to claim 8, wherein the third conductive layer is a stacked layer.

10. The method for manufacturing a semiconductor device according to claim 8, wherein the first conductive layer is a stacked layer.

11. The method for manufacturing a semiconductor device according to claim 8, wherein the second conductive layer is a stacked layer.

12. The method for manufacturing a semiconductor device according to claim 8, wherein the first conductive layer is thinner than the second conductive layer.

13. The method for manufacturing a semiconductor device according to claim 8, wherein the second conductive layer is five times or more as thick as the first conductive layer.

14. The method for manufacturing a semiconductor device according to claim 8, wherein a thickness of the second conductive layer is 300 nm to 7 μm.

15. The method for manufacturing a semiconductor device according to claim 8, wherein the first conductive layer is connected to a transistor.

16. The method for manufacturing a semiconductor device according to claim 8, wherein a stack of the first conductive layer, the second conductive layer, and the third conductive layer is used as a wiring of a wireless chip.

17. The method for manufacturing a semiconductor device according to claim 8, wherein a stack of the first conductive layer, the second conductive layer, and the third conductive layer is used as an antenna of a wireless chip.

18. The method for manufacturing a semiconductor device according to claim 8, wherein a stack of the first conductive layer, the second conductive layer, and the third conductive layer is used as a wiring of a display device.

19. The method for manufacturing a semiconductor device according to claim 8, wherein a stack of the first conductive layer, the second conductive layer, and the third conductive layer is used as a wiring of a memory circuit.

20. The method for manufacturing a semiconductor device according to claim 8, wherein a stack of the first conductive layer, the second conductive layer, and the third conductive layer is used as a wiring of an electronic device.

21. The method for manufacturing a semiconductor device according to claim 8, wherein a stack of the first conductive layer, the second conductive layer, and the third conductive layer is used as a wiring of a camera, a projector, a head mounted display, a navigation system, a stereo, a personal computer, a game machine, a portable information terminal, a mobile computer, a cellular phone, an electronic book, an image reproducing device provided with a recording medium, or a television.

22. A method for manufacturing a semiconductor device comprising:
forming a first conductive layer containing molybdenum over an insulating surface;
forming a second conductive layer containing aluminum over the first conductive layer;
forming a resist mask over the second conductive layer;
processing the second conductive layer by dry etching using the resist mask; and
processing the first conductive layer by wet etching using the resist mask,
wherein an etching rate of the second conductive layer is higher than that of the first conductive layer in the dry etching, and
wherein an etching rate of the second conductive layer is equal to or higher than that of the first conductive layer in the wet etching.

23. The method for manufacturing a semiconductor device according to claim 22 or 7, wherein the dry etching is performed by a chlorine-based gas.

24. The method for manufacturing a semiconductor device according to claim 22 or 7, wherein the dry etching is performed by using a gas including at least one gas selected from the group consisting of $Cl_2$, $BCl_3$, $SiCl_4$ and $CCl_4$.

25. The method for manufacturing a semiconductor device according to claim 22 or 7, wherein the first conductive layer is thinner than the second conductive layer.

26. The method for manufacturing a semiconductor device according to claim 22 or 7, wherein the second conductive layer is five times or more as thick as the first conductive layer.

27. The method for manufacturing a semiconductor device according to claim 22 or 7, wherein a thickness of the second conductive layer is 300 nm to 7 μm.

28. The method for manufacturing a semiconductor device according to claim 22 or 7, wherein the first conductive layer is connected to a transistor.

29. The method for manufacturing a semiconductor device according to any one of claims 1, 22 and 7, wherein a stack of the first conductive layer and the second conductive layer is used as a wiring of a wireless chip.

30. The method for manufacturing a semiconductor device according to any one of claims 1, 22 and 7, wherein a stack of the first conductive layer and the second conductive layer is used as an antenna of a wireless chip.

31. The method for manufacturing a semiconductor device according to any one of claims 1, 22 and 7, wherein a stack of the first conductive layer and the second conductive layer is used as a wiring of a display device.

32. The method for manufacturing a semiconductor device according to any one of claims 1, 22 and 7, wherein a stack of the first conductive layer and the second conductive layer is used as a wiring of a memory circuit.

33. The method for manufacturing a semiconductor device according to any one of claims 1, 22 and 7, wherein a stack of the first conductive layer and the second conductive layer is used as a wiring of an electronic device.

34. The method for manufacturing a semiconductor device according to any one of claims 1, 22 and 7, wherein a stack of the first conductive layer and the second conductive layer is used as a wiring of a camera, a projector, a head mounted display, a navigation system, a stereo, a personal computer, a game machine, a portable information terminal, a mobile computer, a cellular phone, an electronic book, an image reproducing device provided with a recording medium, or a television.

* * * * *